(12) United States Patent
Kramer

(10) Patent No.: US 11,251,220 B2
(45) Date of Patent: Feb. 15, 2022

(54) MONOLITHIC MULTI-METALLIC THERMAL EXPANSION STABILIZER

(71) Applicant: Raytheon Company, Waltham, MA (US)

(72) Inventor: Detlef Kramer, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 119 days.

(21) Appl. No.: 16/844,128

(22) Filed: Apr. 9, 2020

(65) Prior Publication Data

US 2021/0320134 A1    Oct. 14, 2021

(51) Int. Cl.
*H01L 27/146* (2006.01)
*H01L 23/00* (2006.01)

(52) U.S. Cl.
CPC ........ *H01L 27/1465* (2013.01); *H01L 23/562* (2013.01); *H01L 27/1469* (2013.01); *H01L 27/14634* (2013.01); *H01L 27/14636* (2013.01); *H01L 27/14696* (2013.01)

(58) Field of Classification Search
CPC ............. H01L 27/1465; H01L 27/1469; H01L 27/14636; H01L 23/562; H01L 27/14696; H01L 27/14634
See application file for complete search history.

(56) References Cited

U.S. PATENT DOCUMENTS

| 4,751,099 | A | 6/1988 | Niino |
| 7,300,619 | B2 | 11/2007 | Napadensky |
| 7,723,815 | B1 * | 5/2010 | Peterson ............. H01L 31/0203 257/443 |
| 10,279,578 | B2 | 5/2019 | Bandyopadhyay |
| 2008/0113495 | A1 | 5/2008 | Ginn et al. |
| 2015/0044084 | A1 | 2/2015 | Hofmann |
| 2020/0003559 | A1 | 1/2020 | Kawakami |

FOREIGN PATENT DOCUMENTS

| EP | 0831533 A1 | 3/1998 |
| WO | 2015094720 A1 | 6/2015 |

OTHER PUBLICATIONS

International Search Report and Written Opinion dated Apr. 14, 2021 in corresponding International Application PCT/US2021/016716.

* cited by examiner

*Primary Examiner* — Tucker J Wright
(74) *Attorney, Agent, or Firm* — Renner, Otto, Boisselle & Sklar, LLP

(57) ABSTRACT

A monolithic multi-metallic thermal expansion stabilizer (MTES) has a coefficient of thermal expansion (CTE) differential between a first surface and a second surface, and a transition region extending between for mitigating the CTE differential.

20 Claims, 3 Drawing Sheets

MONOLITHIC MULTI-METALLIC THERMAL EXPANSION STABILIZER

TECHNICAL FIELD

The present disclosure relates generally to an infrared sensor chip assembly and more particularly to a method and device to provide thermal expansion matching between components of the infrared sensor chip assembly.

BACKGROUND

Many currently used infrared sensor chip assemblies include silicon readout integrated circuits (ROIC) that are hybridized to mercury cadmium telluride (HgCdTe) detector arrays using indium (In) interconnects. But these interconnects (also referred to as indium bumps) often fail due to issues caused by thermal cycling and the coefficient of thermal expansion (CTE) mismatch between ROIC and HgCdTe.

To overcome this issue CTE matching has been attempted between the ROIC and the platform by adhesively bonding titanium (Ti) and silicon (Si) shims to the back of a sensor chip assembly (SCA) after dicing and hybridization. While this approach can be effective, it is an expensive die-level process and is performed manually by skilled labor.

Similarly, epitaxial growth of III-V semiconductor materials has been attempted using gallium nitride (GaN) on a silicon (Si) substrate using buffer layers to provide the lattice match. But III-V layers can cause degraded performance due to stress associated with CTE mismatches between the III-V devices and silicon (Si) substrates.

SUMMARY

The present disclosure provides a monolithic multi-metallic thermal expansion stabilizer (MTES) having a coefficient of thermal expansion (CTE) differential between a first surface and a second surface and a transition region extending between for mitigating the CTE differential.

The MTES (also referred to as a shim) may be produced using additive manufacturing (e.g., a two-parameter laser powder metal additive manufacturing process). For example the first surface may be made of a first metal that closely matches a CTE of silicon readout integrated circuits (e.g., 64FeNi also referred to as FeNi36 outside the US or Invar) and the second surface may be made of a second metal that causes a contraction rate of the ROIC to match a contraction rate of the detector (e.g., 17-7 steel). In between the first and second surface, the MTES includes a transition region composed of varying amounts of the first and second metal. For example, the first surface may be composed entirely of the first metal and the second surface may be composed entirely of the second metal. Moving along an axis extending between the first surface and the second surface, the composition of the MTES may vary from entirely the first metal at the first surface to entirely the second metal at the second surface.

The present disclosure also provides a MTES manufactured using ultrasonic additive manufacturing (AM) to ultrasonically weld thin layers together. For example, the first surface may be a layer composed entirely of the first metal and the second surface may be a layer composed entirely of the second metal. Moving along an axis extending between the first layer and the second layer, the MTES may include a transition region formed by a plurality of layers that are ultrasonically welded together. The composition of the layers making up the MTES may vary from being entirely made of the first metal at the first surface to being entirely made of the second metal at the second surface.

The present disclosure provides a monolithic multi-metallic thermal expansion stabilizer (MTES) for causing the contraction of silicon readout integrated circuits (ROIC) to match contraction of a detector hybridized to the ROIC via interconnects. The MTES includes a first major surface, a second major surface, and a transition region. The first major surface is made of a first metal having a first coefficient of thermal expansion (CTE). The first CTE matches a CTE of the ROIC. The second major surface made of a second metal having a second CTE causing a contraction rate of the ROIC to match a contraction rate of the detector. The second CTE matches a CTE. The first CTE differs from the second CTE, such that a CTE differential exists between the first major surface and the second major surface. The transition region extends between the first major surface and the second major surface and configured to mitigate the CTE differential. The transition region is composed of a combination of the first metal and the second metal. The composition of the transition region varies along an axis extending between the first major surface and the second major surface, such that: a first portion of the transition region adjacent the first major surface is mostly made up of the first metal; and a second portion of the transition region adjacent the second major surface is mostly made up of the second metal.

Alternatively or additionally, the composition of the transition region varies along the axis, such that: segments of the transition region located along the axis that are closer to the first major surface include a higher percentage or a same percentage of the first metal compared to other portions of the transition region located along the axis that are further from the first major surface.

Alternatively or additionally, the composition of the transition region varies along the axis, such that: segments of the transition region located along the axis that are closer to the second major surface include a higher percentage or a same percentage of the second metal compared to other segments of the transition region located along the axis that are further from the second major surface.

Alternatively or additionally, the transition region includes layers perpendicular to and intersecting with the axis. Each of the layers is at least partially composed of the first metal and/or the second metal. A weight percentage of each layer that is made of the first metal decreases from a maximum in a layer adjacent the first major surface to a minimum at a layer adjacent the second major surface.

Alternatively or additionally, the transition region includes layers perpendicular to and intersecting with the axis. Each of the layers is at least partially composed of the first metal and/or the second metal. A weight percentage of each layer that is made of the second metal decreases from a maximum in a layer adjacent the second major surface to a minimum at a layer adjacent the first major surface.

Alternatively or additionally, the transition region includes a first metal portion, a second metal portion, and a mixed metal portion. The mixed metal portion is located between the first metal portion and the second metal portion along the axis. The first metal portion is made entirely of the first metal. The second metal portion is made entirely of the second metal. A composition of the mixed metal portion varies along the axis such that: areas of the mixed metal portion that are closer to the first metal portion include a higher percentage or a same percentage of the first metal compared to other areas of the mixed metal portion that are further from the first metal portion; and areas of the mixed metal portion that are closer to the second metal portion include a higher percentage or a same percentage of the second metal compared to other areas of the mixed metal portion that are further from the second metal portion.

Alternatively or additionally, a thickness of the first metal portion along the axis is at least 25% to 30% of a thickness of the MTES along the axis. A thickness of the second metal portion along the axis is at least 25% to 30% of a thickness of the MTES along the axis.

Alternatively or additionally, the composition of the mixed metal portion varies such that a weight percent composition of the first metal along the axis varies continuously. The composition of the mixed metal portion varies such that a weight percent composition of the second metal along the axis varies continuously.

Alternatively or additionally, the first metal comprises 64FeNi.

Alternatively or additionally, the second metal comprises 17-7 steel.

The present disclosure also provides an infrared sensor chip assembly including the MTES, silicon readout integrated circuits (ROIC), mercury cadmium tellurium (HgCdTe) detector array, and a platform. The ROIC are bonded to the first major surface of the MTES. The detector array is hybridized to the ROIC by interconnects. The platform bonded to the second major surface of the MTES.

The present disclosure additional provides a method of additively manufacturing a monolithic multi-metallic thermal expansion stabilizer (MTES) for causing the contraction of silicon readout integrated circuits (ROIC) to match contraction of a detector hybridized to the ROIC via interconnects. The method includes forming an initial layer of the MTES out of a first distinct material, wherein the first distinct material is a first distinct material of two distinct materials and forming a final layer of the MTES out of a second distinct material. The second distinct material is one of the two distinct materials. The second distinct material differs in composition from the first distinct material. The first distinct materials is a first metal. The second distinct material is a second metal. The first metal has a first coefficient of thermal expansion (CTE) matching a CTE of the ROIC. The second metal has a second CTE, such that: a contraction rate of the ROIC matches a contraction rate of the detector; and a CTE differential exists between the initial layer and the final layer. The method also includes forming a transition region of the MTES extending between the initial layer and the final layer to mitigate the CTE differential. The transition region is formed out of the two distinct materials. A composition of the transition region ("compositional gradient") varies along an axis extending between the initial layer and the final layer, such that: a first portion of the transition region adjacent the initial layer is mostly made up of the first distinct material; and a second portion of the transition region adjacent the final layer is mostly made up of the second distinct material. The forming of the transition region includes: sequentially adding a plurality of layers to the initial layer by varying a composition of each of the plurality of layers to form the compositional gradient. The forming of the final layer includes adding the final layer to a surface of the transition region located opposite the initial layer along the axis.

Alternatively or additionally, the compositional gradient varies along the axis, such that: layers of the transition region located along the axis that are closer to the initial layer include a higher percentage or a same percentage of the first distinct material compared to other layers of the transition region located along the axis that are further from the initial layer.

Alternatively or additionally, the compositional gradient varies along the axis, such that: layers of the transition region located along the axis that are closer to the final layer include a higher percentage or a same percentage of the second distinct material compared to other layers of the transition region located along the axis that are further from the final layer.

Alternatively or additionally, the transition region includes a first material portion, a second material portion, and a mixed material portion. The first material portion is made of a plurality of layers ("first material layers"). The first material layers are made entirely of the first distinct material. The second material portion is made of a plurality of layers ("second material layers"). The second material layers are made entirely of the second distinct material. The mixed material portion is made of a plurality of layers ("mixed material layers"). The forming of the transition region includes: sequentially adding the first material layers to the initial layer to form the first material portion. After forming the first material portion, sequentially adding the mixed material layers to the first material portion to form the mixed material portion by modifying a composition of the mixed material layers such that: layers of the mixed material layers that are closer to the first material portion include a higher percentage or a same percentage of the first distinct material compared to other layers of the mixed material layers that are further from the first material portion; and layers of the mixed material layers that are closer to the second material portion include a higher percentage or a same percentage of the second distinct material compared to other layers of the mixed material layers that are further from the second material portion. After forming the mixed material portion, sequentially adding the second material layers to the mixed material portion to form the second material portion.

Alternatively or additionally, the first metal comprises 64FeNi.

Alternatively or additionally, the second metal comprises 17-7 steel.

Alternatively or additionally, the method also includes machining the initial layer and the final layer to improve flatness and parallelism of the initial layer and the final layer.

Alternatively or additionally, the forming of the initial layer, the final layer, and the plurality of layers of the transition region comprises depositing each of the layers using laser powder metal additive manufacturing.

Alternatively or additionally, the forming of the initial layer, the final layer, and the plurality of layers of the transition region comprises ultrasonically welding each of the layers using ultrasonic additive manufacturing.

While a number of features are described herein with respect to embodiments of the invention; features described with respect to a given embodiment also may be employed in connection with other embodiments. The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention in which similar reference numerals are used to indicate the same or similar parts in the various views.

Figure 1:
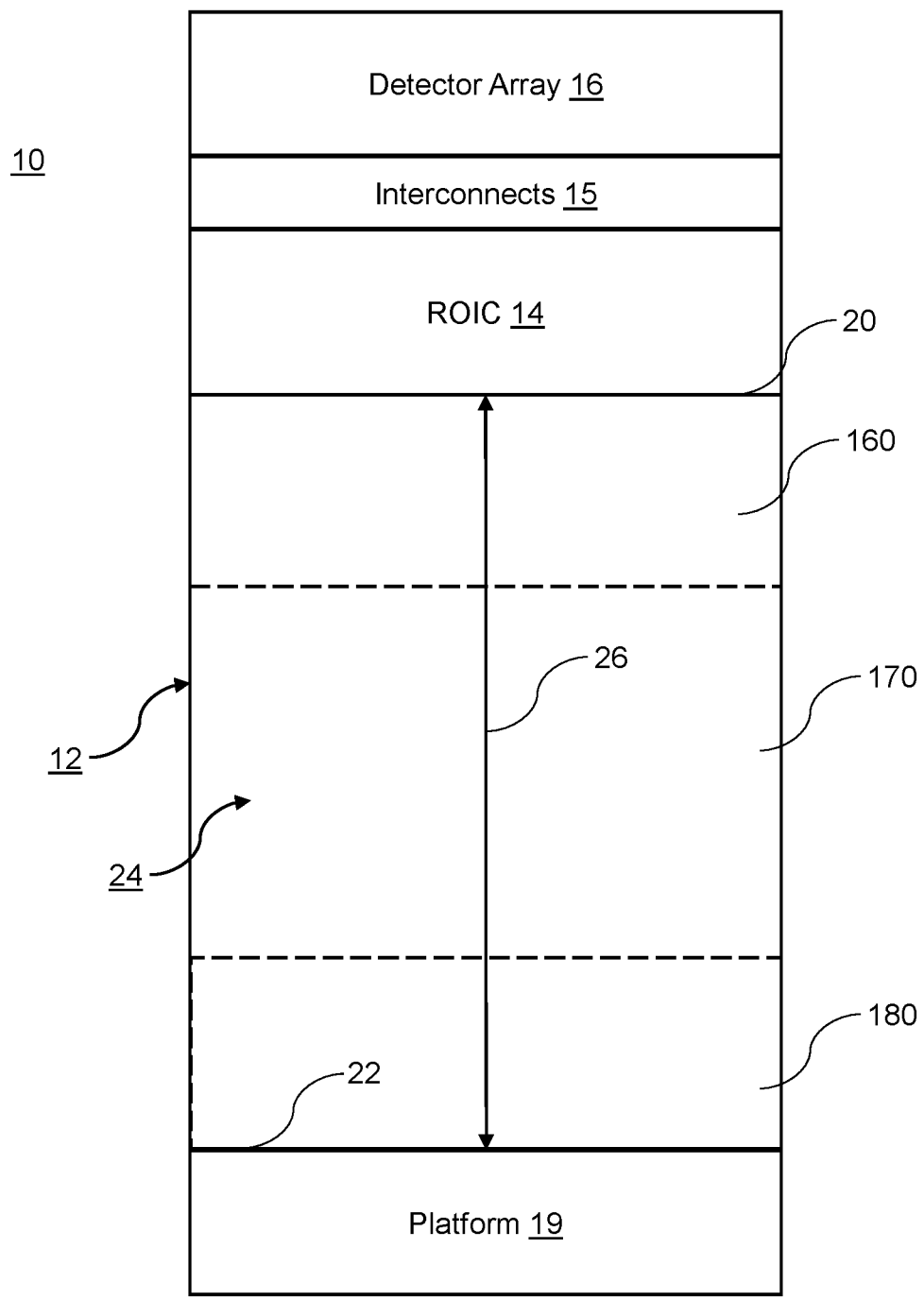
FIG. 1 is a schematic illustration of an infrared sensor chip assembly including a monolithic multi-metallic thermal expansion stabilizer (MTES).

The present invention is described below in detail with reference to the drawings. In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

DETAILED DESCRIPTION

The present invention provides a monolithic multi-metallic thermal expansion stabilizer (MTES) having a first major surface, a second major surface, and a transition region extending between the first and second major surfaces. The coefficient of thermal expansion (CTE) differs between the first major surface and the second major surface. The transition region is configured to mitigate this CTE differential.

Turning to FIG. 1, an infrared sensor chip assembly 10 including a monolithic multi-metallic thermal expansion stabilizer (MTES) ("shim") 12, silicon readout integrated circuits (ROIC) 14, indium interconnects 15, a mercury cadmium telluride (HgCdTe) detector array 16, and a platform 19 is shown. The ROIC 14 and the detector array 16 are interconnected mechanically and electrically (hybridized) as a subassembly via interconnects 15 and are in turn bonded to the shim 12.

During operation, the detector array 16 is typically cooled to cryogenic temperatures (<100 K). Due to the difference in CTE between silicon and HgCdTe, the detector array 16 contracts approximately four times faster than the ROIC 14. This differential in contraction strains the interconnects 15. As the detector array 16 is cycled from ambient to operating temperatures, the interconnects 15 undergo strain cycling, often causing the interconnects 15 to fail due to fatigue. The shim 12 acts to cause the contraction of the ROIC 14 to match the contraction of the detector array 16. By using the shim 12, the contraction of the ROIC 14 can be controlled to more closely match the contraction of the HgCdTe detector 16, reducing strain on the interconnects 15 and reducing failure.

The shim 12 includes a first major surface 20, a second major surface 22, and a transition region 24 extending between the first major surface and the second major surface. The shim 12 is oriented relative to the ROIC 14 and the detector array 16. The first major surface 20 is made of a first metal having a first coefficient of thermal expansion (CTE) matching a CTE of the ROIC 14 and is orientated so that this surface is adjacent the ROIC 14. The second major surface 22 is made of a second metal having a second CTE, such that it causes the ROIC 14 to contract at the same rate as the detector array 16. The second major surface 22 is located opposite the first major surface 20. For example, the first metal may be 64FeNi and the second metal may be 17-7 steel.

The first metal having a first CTE matching a CTE of the ROIC 14 does not require that the first CTE be exactly equal to the CTE of the ROIC 14. Rather, the first CTE may approximately equal the CTE of the ROIC. For example, the first CTE may be within ±1%, ±2%, or ±5% of the CTE of the ROIC. All of these various ranges may be encompassed by the terms "match" and "matching."

Similarly, the metal having a second CTE matching a CTE that causes the ROIC 14 to contract at the same rate as the detector array does not require that the second CTE be exactly equal to the CTE that causes the ROIC 14 to contract at the same rate as the detector. Rather, the second CTE may approximately equal a CTE that causes the ROIC 14 to contract at the same rate as the detector array 16. For example, the second CTE may be within ±1%, ±2%, or ±5% of the CTE that causes the ROIC 14 to contract at the same rate as the detector array 16.

The first CTE differs from the second CTE, such that a CTE differential exists between the first major surface 20 and the second major surface 22. The transition region 24 extending between the first major surface 20 and the second major surface 22 is configured to mitigate this CTE differential.

The transition region 24 is composed of a combination of the first metal and the second metal. The composition of the transition region 24 varies along an axis 26 extending between the first major surface 20 and the second major surface 22, such that (1) a first portion of the transition region 30 adjacent the first major surface 20 is made primarily of the first metal and (2) a second portion 32 of the transition region adjacent the second major surface 22 is made primarily of the second metal.

The composition of the transition region 26 may vary along the axis 26, such that portions of the transition region 24 located along the axis 26 that are closer to the first major surface 20 may include a higher percentage or a same percentage of the first metal compared to other portions of the transition region 24 located along the axis 26 that are further from the first major surface 20. When referring to a region or layer as including a percentage of a particular metal or material, this percentage may refer to a percentage by weight.

Similarly, the composition of the transition region 24 may vary along the axis 26, such that segments of the transition region 24 located along the axis 26 that are closer to the second major surface 22 may include a higher percentage or a same percentage of the second metal compared to other segments of the transition region 24 located along the axis 26 that are further from the second major surface 22.

Figure 2:
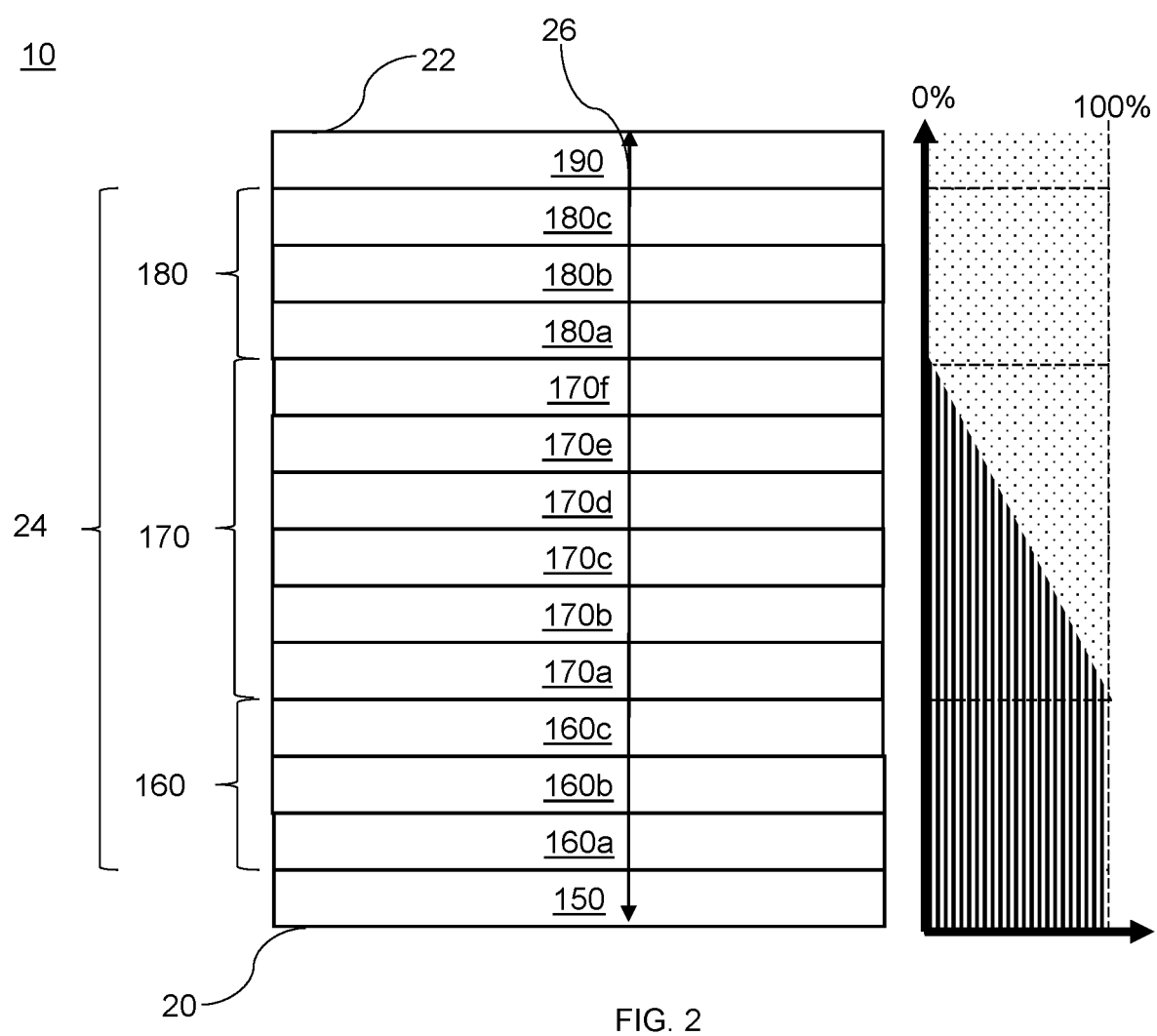
FIG. 2 is a schematic view of a MTES formed by a series of layers and depicts an exemplary composition of the layers.

Turning to FIG. 2, the transition region 26 may include layers 160, 170, 180 perpendicular to and intersecting with the axis 26. Each of the layers may be at least partially composed of the first metal and/or the second metal. A percentage (e.g., weight percentage) of each layer that is made of the first metal may decrease from a maximum in a layer 150 adjacent the first major surface 20 to a minimum at a layer 190 adjacent the second major surface 22.

Similarly, a percentage (e.g., weight percentage) of each layer that is made of the second metal may decrease from a maximum in a layer 190 adjacent the second major surface 22 to a minimum at a layer 150 adjacent the first major surface 20.

With continued reference to FIG. 2, the transition region 24 may include a first metal portion 160, a second metal portion 180, and a mixed metal portion 170. A composition of these layers is also shown to the right of the layers in the figure. A percent composition of the layers being the first metal is shown using an area made of vertical lines, while a percent composition of the layers being the second metal is shown using a dotted area. The mixed metal portion 170 may be located between the first metal portion 160 and the second metal portion 180 along the axis 26.

As shown, the first metal portion 160 may be made entirely of the first metal. Similarly, the second metal portion 180 may be made entirely of the second metal. The composition of the mixed metal portion 170 may vary along the axis 26 such that areas of the mixed metal portion 170 that are closer to the first metal portion 160 include a higher percentage or a same percentage of the first metal compared to other areas of the mixed metal portion 170 that are further from the first metal portion 160. The composition of the mixed metal portion 170 may also vary along the axis 26 such that areas of the mixed metal portion 170 that are closer to the second metal portion 180 include a higher percentage or a same percentage of the second metal compared to other areas of the mixed metal portion that are further from the second metal portion 180.

The composition of the mixed metal portion 170 may vary such that a percent composition of the first metal along the axis 26 varies continuously. Similarly, the composition of the mixed metal portion 170 may vary such that a percent composition of the second metal along the axis 26 varies continuously. For example, in FIG. 2 the composition of the mixed metal portion 170 varies linearly from including mostly first metal to including mostly second metal. This compositional variance (also referred to as a compositional gradient) may instead vary geometrically or in any suitable manner configured to reduce failure of the infrared sensor chip assembly 10.

A thickness of the first metal portion 160 along the axis 26 may be approximately 25% to 30% of a thickness of the shim 12 along the axis 26. A thickness of the second metal portion 180 along the axis 26 may be 25% to 30% of a thickness of the shim 12 along the axis 26.

Figure 3:
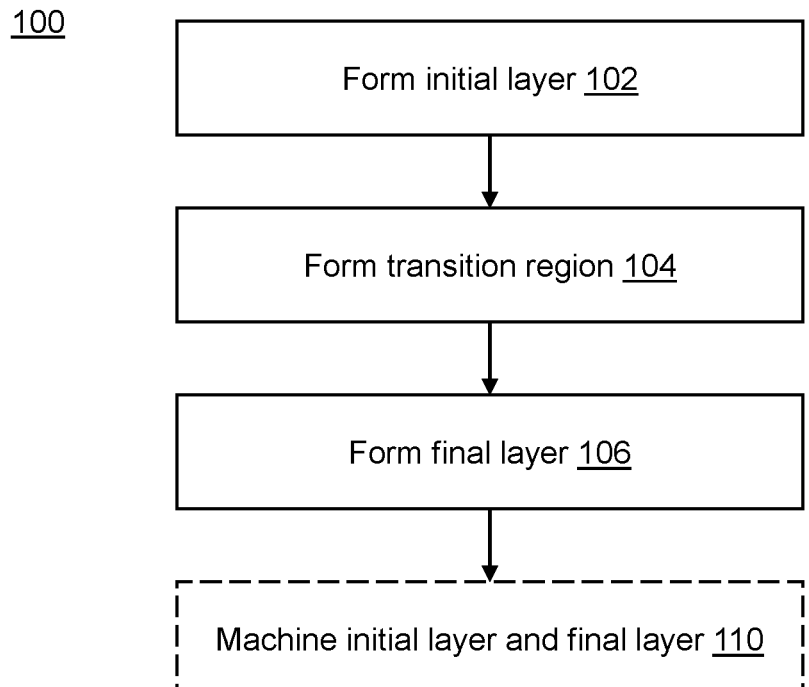
FIG. 3 is a flow diagram depicting a method of producing the MTES of FIG. 1.

Turning to FIG. 3, a method 100 for additively manufacturing a monolithic multi-metallic thermal expansion stabilizer (MTES) ("shim") 12 is shown. In process block 102, an initial layer 150 of the shim 12 is formed out of a first distinct material (i.e., one of two distinct materials). In FIG. 2, the initial layer 150 is shown as including the first major surface 20 and as being made of the first metal. However, the initial layer 150 may instead include the second major surface 22 and be made of the second metal.

In process block 104, a transition region 24 of the shim 12 extending between the initial layer 150 and a final layer 190 is formed to mitigate the CTE differential. As described above, the transition region 180 is formed out of the two distinct materials. The composition of the transition region ("compositional gradient") varies along the axis 26 extending between the initial layer 150 and the final layer 190. The transition region 24 is formed by sequentially adding a plurality of layers to the initial layer 150 and by varying a composition of each of the plurality of layers to form the compositional gradient.

In process block 106, the final layer 190 of the shim 12 is formed out of a second distinct material (i.e., the other one of the two distinct materials different from the first distinct material). The forming of the final layer 190 includes adding the final layer 190 to a surface of the transition region 24 located opposite the initial layer 150 along the axis 26. In FIG. 2, the final layer 190 is shown as including the second major surface 22 and as being made of the second metal. However, the final layer 190 may instead include the first major surface 20 and be made of the first metal.

The two distinct materials are the first metal and the second metal. As described above, the first metal has a first CTE matching a CTE of the ROIC 14 and the second metal has a second CTE that causes the ROIC 14 to contract at the same rate as the detector array 16.

The first distinct material may be the first metal. Similarly, the second distinct material may be the second metal. Alternatively, the first distinct material may be the second metal and the second distinct material may be the first metal.

Figure 4:
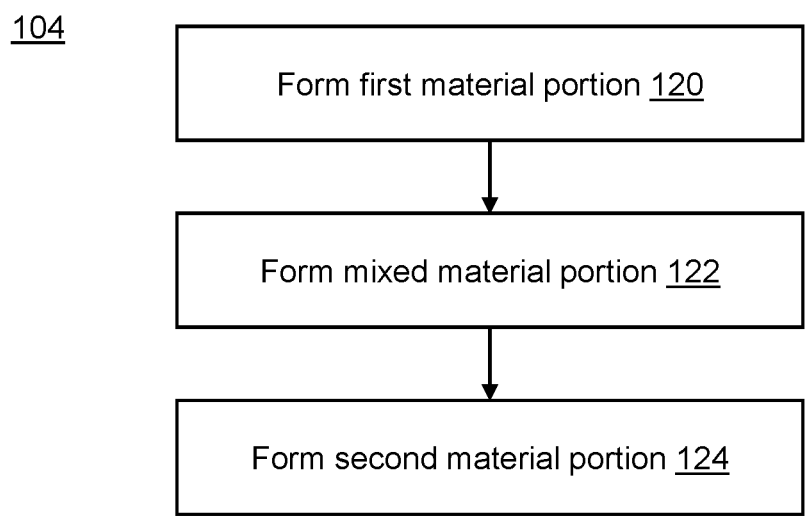
FIG. 4 is a flow diagram depicting a method for forming a transition region of the MTES of FIG. 1.

Turning to FIG. 4, the step of forming the transition region 180 of the shim 12 is shown. In process block 120, a first portion 160 (also referred to as the first metal portion) of the transition region 24 is formed adjacent the initial layer 150 primarily out of the first distinct material. In process block 122, the mixed material portion 170 is formed. In process block 124, a second portion 180 (also referred to as the second metal portion) of the transition region 26 is formed adjacent the final layer 190 primarily out of the second distinct material.

The compositional gradient may vary along the axis 26, such that layers of the transition region 24 located along the axis 26 that are closer to the initial layer 150 include a higher percentage or a same percentage of the first distinct material compared to other layers of the transition region 24 located along the axis 26 that are further from the initial layer 150. Similarly, the compositional gradient may vary along the axis 26, such that layers of the transition region 24 located along the axis 26 that are closer to the final layer 190 include a higher percentage or a same percentage of the second distinct material compared to other layers of the transition region 24 located along the axis 26 that are further from the final layer 190.

As described above, the transition region 24 may include a first material portion 160, a second material portion 180, and a mixed material portion 170. The first material portion 160 is made of a plurality of layers 160a-160c ("first material layers"). The first material layers 160 may be made entirely of the first distinct material. The second material portion 180 is made of a plurality of layers 180a-180c ("second material layers"). The second material layers may be made entirely of the second distinct material. The mixed material portion 170 may also made of a plurality of layers 170a-170e ("mixed material layers").

Turning back to FIG. 2, forming the transition region 24 may include sequentially adding the first material layers 160a-160c to the initial layer 150 to form the first material portion 160. After forming the first material portion 160, the mixed material layers 170a-170f may be sequentially added to the first material portion 160 to form the mixed material portion 170. The composition of the mixed material layers 170 may be modified such that layers of the mixed material layers 170 that are closer to the first material portion 160 include a higher percentage or a same percentage of the first distinct material compared to other layers of the mixed material layers 170 that are further from the first material portion 160.

The composition of the mixed material layers 170 may also be modified such that layers of the mixed material layers 170 that are closer to the second material portion 180 include a higher percentage or a same percentage of the second distinct material compared to other layers of the mixed material layers 170 that are further from the second material portion 180.

After forming the mixed material portion 170, the second material layers 180 may be sequentially added to the mixed material portion 170 to form the second material portion 180.

After adding the different layers to form the shim 12, the method 100 may further include machining the initial layer 150 and the final layer 190 to improve flatness and parallelism of the initial layer 150 and the final layer 190.

Various additive manufacturing techniques may be used to build the shim by depositing material layer-by-layer using computer aided processing. For example, forming the initial layer 150, the final layer 190, and the plurality of layers of the transition region 24 may include depositing each of the layers using laser powder metal additive manufacturing (AM).

Laser powder metal additive manufacturing is an additive manufacturing process for fabricating metal parts from a Computer Aided Design (CAD) solid model. The laser powder metal additive manufacturing process fabricates a part by a laser head emitting a beam onto a Substrate mounted on a worktable. Either substrate or laserhead is moved in the X-Y direction to deposit a thin layer of metal, creating a layer of the shim 12. After a layer is deposited, the laser head and powder nozzles move incrementally in the positive Z-direction, creating a 3-dimensional structure.

Alternatively, forming the initial layer 150, the final layer 190, and the plurality of layers of the transition region 24 may include ultrasonically welding each of the layers together using ultrasonic additive manufacturing. That is, the individual layers may be formed separately and organized and ultrasonically welded together to form the compositional gradient.

The ROIC 14 may be substantially planarized and may include various circuit elements, traces and CMOS devices. The ROIC 14 may be approximately 10 μm thick. Shim 12 orientation matter. The ROIC 14 is affixed or bonded to the first major surfaces 20 of the shim 12 using any suitable technique. For example, an adhesive including a bonding oxide may be deposited onto the first major surface 20.

The first metal may be any alloy that, when bonded to a surface of the ROIC 14 opposite the interconnects 15, alters the rate of thermal expansion of the ROIC 14 in a desirable manner. In other words, the first metal may include any material suitable for bonding to the ROIC 14 and having a CTE that is different than the CTE of the ROIC 14. In certain embodiments, the thermal matching substrate may be a substrate that forms a composite-semiconductor structure having a desired rate of thermal expansion. This desired rate of thermal expansion may be substantially equal to the rate of thermal expansion of a substrate to which the ROIC 14 is to be hybridized.

The second metal may be any alloy that, when bonded to the platform 19, alters the rate of thermal expansion of the ROIC 14 in a desirable manner. In other words, the second metal may include any material suitable for bonding to the platform 19 and having a CTE similar to the CTE of the ROIC 14. This desired rate of thermal expansion may be substantially equal to the rate of thermal expansion of a substrate to which the detector array 16 is to be hybridized.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

All ranges and ratio limits disclosed in the specification and claims may be combined in any manner. Unless specifically stated otherwise, references to "a," "an," and/or "the" may include one or more than one, and that reference to an item in the singular may also include the item in the plural.

Although the invention has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A monolithic multi-metallic thermal expansion stabilizer (MTES) for causing the contraction of silicon readout integrated circuits (ROIC) to match contraction of a detector hybridized to the ROIC via interconnects, the MTES comprising:
   a first major surface made of a first metal having a first coefficient of thermal expansion (CTE), wherein the first CTE matches a CTE of the ROIC;
   a second major surface made of a second metal having a second CTE causing a contraction rate of the ROIC to match a contraction rate of the detector, wherein:
   the second CTE matches a CTE; and
   the first CTE differs from the second CTE, such that a CTE differential exists between the first major surface and the second major surface; and
   a transition region extending between the first major surface and the second major surface and configured to mitigate the CTE differential, wherein:
   the transition region is composed of a combination of the first metal and the second metal; and
   the composition of the transition region varies along an axis extending between the first major surface and the second major surface, such that:
   a first portion of the transition region adjacent the first major surface is mostly made up of the first metal; and
   a second portion of the transition region adjacent the second major surface is mostly made up of the second metal.

2. The MTES of claim 1, wherein the composition of the transition region varies along the axis, such that:
   segments of the transition region located along the axis that are closer to the first major surface include a higher percentage or a same percentage of the first metal compared to other portions of the transition region located along the axis that are further from the first major surface.

3. The MTES of claim 1, wherein the composition of the transition region varies along the axis, such that:
  segments of the transition region located along the axis that are closer to the second major surface include a higher percentage or a same percentage of the second metal compared to other segments of the transition region located along the axis that are further from the second major surface.

4. The MTES of claim 1, wherein:
  the transition region includes layers perpendicular to and intersecting with the axis;
  each of the layers is at least partially composed of the first metal and/or the second metal; and
  a weight percentage of each layer that is made of the first metal decreases from a maximum in a layer adjacent the first major surface to a minimum at a layer adjacent the second major surface.

5. The MTES of claim 1, wherein:
  the transition region includes layers perpendicular to and intersecting with the axis;
  each of the layers is at least partially composed of the first metal and/or the second metal; and
  a weight percentage of each layer that is made of the second metal decreases from a maximum in a layer adjacent the second major surface to a minimum at a layer adjacent the first major surface.

6. The MTES of claim 1, wherein:
  the transition region includes a first metal portion, a second metal portion, and a mixed metal portion;
  the mixed metal portion is located between the first metal portion and the second metal portion along the axis;
  the first metal portion is made entirely of the first metal;
  the second metal portion is made entirely of the second metal; and
  a composition of the mixed metal portion varies along the axis such that:
    areas of the mixed metal portion that are closer to the first metal portion include a higher percentage or a same percentage of the first metal compared to other areas of the mixed metal portion that are further from the first metal portion; and
    areas of the mixed metal portion that are closer to the second metal portion include a higher percentage or a same percentage of the second metal compared to other areas of the mixed metal portion that are further from the second metal portion.

7. The MTES of claim 6, wherein:
  a thickness of the first metal portion along the axis is at least 25% to 30% of a thickness of the MTES along the axis; and
  a thickness of the second metal portion along the axis is at least 25% to 30% of a thickness of the MTES along the axis.

8. The MTES of claim 6, wherein:
  the composition of the mixed metal portion varies such that a weight percent composition of the first metal along the axis varies continuously; and
  the composition of the mixed metal portion varies such that a weight percent composition of the second metal along the axis varies continuously.

9. The MTES of claim 1, wherein the first metal comprises 64FeNi.

10. The MTES of claim 1, wherein the second metal comprises 17-7 steel.

11. An infrared sensor chip assembly comprising:
  the MTES of claim 1;
  silicon readout integrated circuits (ROIC) bonded to the first major surface of the MTES;
  a mercury cadmium tellurium (HgCdTe) detector array hybridized to the ROIC by interconnects; and
  a platform bonded to the second major surface of the MTES.

12. A method of additively manufacturing a monolithic multi-metallic thermal expansion stabilizer (MTES) for causing the contraction of silicon readout integrated circuits (ROIC) to match contraction of a detector hybridized to the ROIC via interconnects, the method comprising:
  forming an initial layer of the MTES out of a first distinct material, wherein the first distinct material is a first distinct material of two distinct materials;
  forming a final layer of the MTES out of a second distinct material, wherein:
    the second distinct material is one of the two distinct materials;
    the second distinct material differs in composition from the first distinct material;
    the first distinct materials is a first metal;
    the second distinct material is a second metal;
    the first metal has a first coefficient of thermal expansion (CTE) matching a CTE of the ROIC;
    the second metal has a second CTE, such that:
      a contraction rate of the ROIC matches a contraction rate of the detector; and
      a CTE differential exists between the initial layer and the final layer; and
  forming a transition region of the MTES extending between the initial layer and the final layer to mitigate the CTE differential, wherein:
    the transition region is formed out of the two distinct materials;
    a composition of the transition region ("compositional gradient") varies along an axis extending between the initial layer and the final layer, such that:
      a first portion of the transition region adjacent the initial layer is mostly made up of the first distinct material; and
      a second portion of the transition region adjacent the final layer is mostly made up of the second distinct material; and
    the forming of the transition region comprises:
      sequentially adding a plurality of layers to the initial layer by varying a composition of each of the plurality of layers to form the compositional gradient; and
    the forming of the final layer comprises adding the final layer to a surface of the transition region located opposite the initial layer along the axis.

13. The method of claim 12, wherein the compositional gradient varies along the axis, such that:
  layers of the transition region located along the axis that are closer to the initial layer include a higher percentage or a same percentage of the first distinct material compared to other layers of the transition region located along the axis that are further from the initial layer.

14. The method of claim 12, wherein the compositional gradient varies along the axis, such that:
  layers of the transition region located along the axis that are closer to the final layer include a higher percentage or a same percentage of the second distinct material compared to other layers of the transition region located along the axis that are further from the final layer.

15. The method of claim 12, wherein:
the transition region includes a first material portion, a second material portion, and a mixed material portion;
the first material portion is made of a plurality of layers ("first material layers");
the first material layers are made entirely of the first distinct material;
the second material portion is made of a plurality of layers ("second material layers");
the second material layers are made entirely of the second distinct material;
the mixed material portion is made of a plurality of layers ("mixed material layers"); and
the forming of the transition region comprises:
sequentially adding the first material layers to the initial layer to form the first material portion;
after forming the first material portion, sequentially adding the mixed material layers to the first material portion to form the mixed material portion by modifying a composition of the mixed material layers such that:
layers of the mixed material layers that are closer to the first material portion include a higher percentage or a same percentage of the first distinct material compared to other layers of the mixed material layers that are further from the first material portion; and
layers of the mixed material layers that are closer to the second material portion include a higher percentage or a same percentage of the second distinct material compared to other layers of the mixed material layers that are further from the second material portion; and
after forming the mixed material portion, sequentially adding the second material layers to the mixed material portion to form the second material portion.

16. The method of claim 12, wherein the first metal comprises 64FeNi.

17. The method of claim 12, wherein the second metal comprises 17-7 steel.

18. The method of claim 12, further comprising machining the initial layer and the final layer to improve flatness and parallelism of the initial layer and the final layer.

19. The method of claim 12, wherein the forming of the initial layer, the final layer, and the plurality of layers of the transition region comprises depositing each of the layers using laser powder metal additive manufacturing.

20. The method of claim 12, wherein the forming of the initial layer, the final layer, and the plurality of layers of the transition region comprises ultrasonically welding each of the layers using ultrasonic additive manufacturing.

* * * * *